US010699925B2

(12) United States Patent
Ogawa et al.

(10) Patent No.: US 10,699,925 B2
(45) Date of Patent: Jun. 30, 2020

(54) TRANSFER SYSTEM

(71) Applicant: Daifuku Co., Ltd., Osaka-shi (JP)

(72) Inventors: Daisuke Ogawa, Komaki (JP); Tsubasa Yajima, Komaki (JP); Masahiro Takahara, Hinocho (JP); Tomoaki Nishikawa, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 134 days.

(21) Appl. No.: 16/156,084

(22) Filed: Oct. 10, 2018

(65) Prior Publication Data

US 2019/0115234 A1 Apr. 18, 2019

(30) Foreign Application Priority Data

Oct. 12, 2017 (JP) .................. 2017-198770

(51) Int. Cl.
*H01L 21/67* (2006.01)
*G08G 1/01* (2006.01)
*H01L 21/677* (2006.01)
*B65G 1/137* (2006.01)

(52) U.S. Cl.
CPC ........ *H01L 21/67265* (2013.01); *B65G 1/137* (2013.01); *G08G 1/0145* (2013.01); *H01L 21/67046* (2013.01); *H01L 21/67051* (2013.01); *H01L 21/6773* (2013.01); *H01L 21/67276* (2013.01); *H01L 21/67703* (2013.01); *H01L 21/67724* (2013.01); *H01L 21/67733* (2013.01)

(58) Field of Classification Search
CPC ......... H01L 21/67276; H01L 21/67703; H01L 21/67046; H01L 21/67733
See application file for complete search history.

(56) References Cited

U.S. PATENT DOCUMENTS

| | | | | |
|---|---|---|---|---|
| 6,005,475 | A | * | 12/1999 | Takasan .................. B61L 3/225 104/88.03 |
| 6,308,818 | B1 | * | 10/2001 | Bonora .................. B65G 19/02 198/465.1 |
| 8,844,092 | B2 | | 9/2014 | Morimoto et al. |
| 2015/0068554 | A1 | * | 3/2015 | Chen ................. H01L 21/67028 134/18 |
| 2017/0137219 | A1 | * | 5/2017 | Harasaki .................. G05D 1/02 |
| 2017/0229333 | A1 | * | 8/2017 | Kinugawa ............. B61L 25/025 |
| 2018/0208404 | A1 | * | 7/2018 | Kumagai ............. H01L 21/677 |

FOREIGN PATENT DOCUMENTS

JP 2013605 A 1/2013

* cited by examiner

*Primary Examiner* — Michael J Zanelli
(74) *Attorney, Agent, or Firm* — The Webb Law Firm

(57) ABSTRACT

Regarding a transfer system that includes a plurality of transfer vehicles that transfer articles, the present invention realizes technology that can alleviate congestion that is caused due to the travel speed of a specific vehicle that performs a specific task being lower than that of the transfer vehicles. The transfer system includes a plurality of transfer vehicles that travel on a transfer path to transfer articles, and the transfer system further includes: a specific vehicle that performs a specific task while travelling on the transfer path at a speed lower than that of the transfer vehicles; and a congestion determination unit that determines whether or not there is congestion behind the specific vehicle. Upon the congestion determination unit determining that there is congestion, the specific vehicle suspends the task and performs evacuation travel to evacuate from a task point at which the specific vehicle was performing the task.

8 Claims, 9 Drawing Sheets

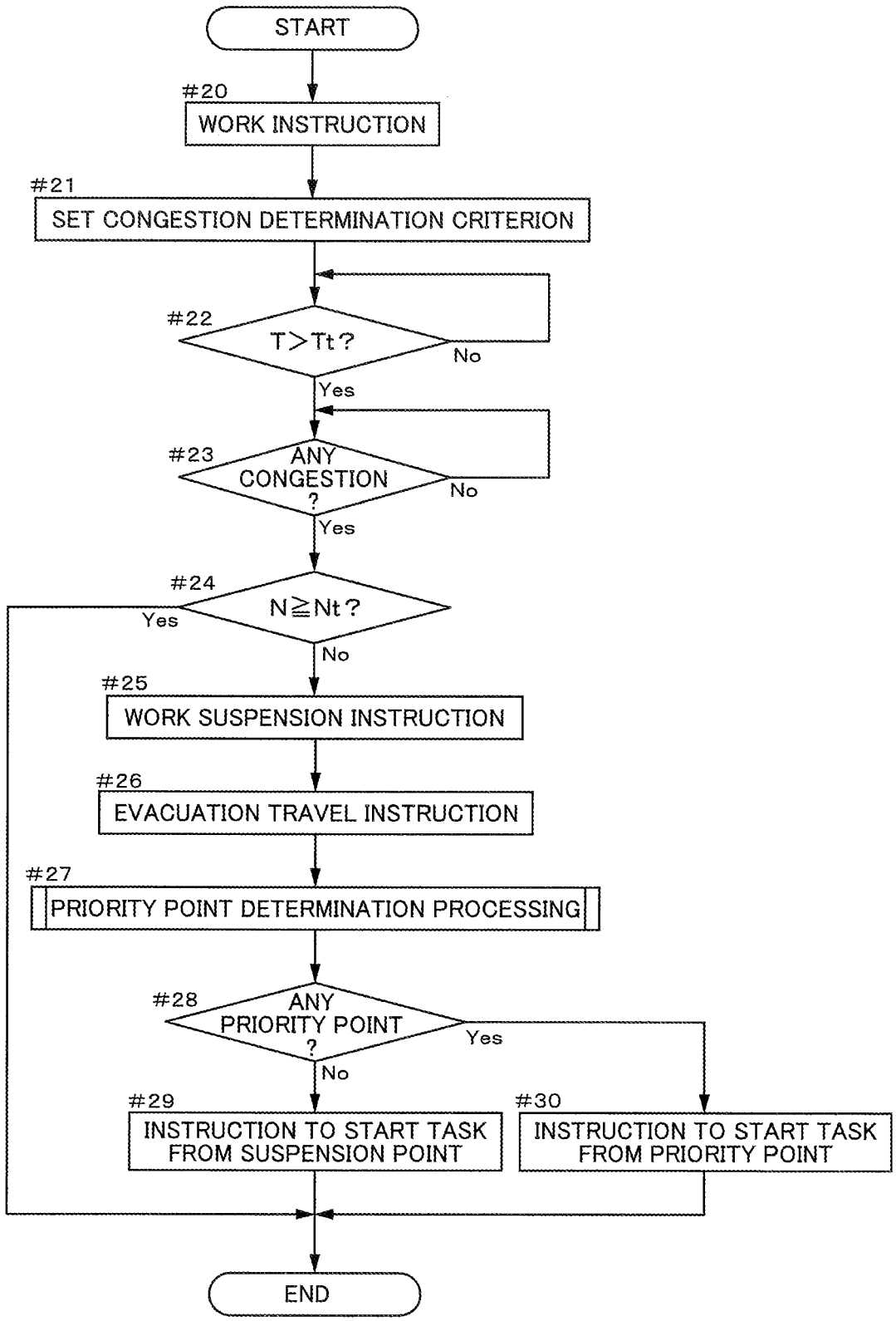

TRANSFER SYSTEM

CROSS-REFERENCE TO RELATED APPLICATION

This application claims priority to Japanese Patent Application No. 2017-198770 filed Oct. 12, 2017, the disclosure of which is hereby incorporated in its entirety by reference.

BACKGROUND OF THE INVENTION

1. Field of the Invention

The present invention relates to a transfer system that includes a plurality of transfer vehicles that travel on a transfer path to transfer articles.

2. Description of the Related Art

For example, JP 2013-000605A discloses a transfer system that includes a plurality of transfer vehicles that travel on a transfer path to transfer articles (in the following description of related art, reference signs in parentheses are those used in a reference document). In this transfer system, articles (7) are transferred by a plurality of transfer carriages (2) that can travel on a travel guide portion (L). This transfer system also includes a cleaning carriage (W) that can travel on the travel guide portion (L) in addition to the aforementioned transfer carriages (2), and the cleaning carriage (W) cleans the travel guide portion (L) by, for example, removing dust attached to the travel guide portion (L). In this way, the transfer system is configured such that a specific vehicle that performs a specific task (the task of cleaning the travel guide portion (L) in this example) other than the task of transferring articles (7) travels on the path that is the same as the path on which the transfer carriages (2) travel.

In order to appropriately clean the travel guide portion (L), the travel speed of the cleaning carriage (W) is often set to be lower than that of the transfer carriages (2). Also, the travel speed of a specific vehicle that performs a specific task other than the task of transferring, which is not limited to the task of cleaning, is set to be lower than that of the transfer carriages (2) in some cases. When such a specific vehicle travels at a speed lower than that of the transfer carriages (2), there are cases in which congestion occurs in a plurality of transfer carriages (2) behind the specific vehicle. However, no specific countermeasure against such congestion is considered in the technology discussed in the aforementioned document.

SUMMARY OF THE INVENTION

Therefore, regarding a transfer system that includes a plurality of transfer vehicles that transfer articles, there is demand for realizing technology that can alleviate congestion that occurs due to the travel speed of a specific vehicle that performs a specific task being lower than that of the transfer vehicles.

Characteristic configurations of a transfer system considering the above-described demand, including a plurality of transfer vehicles that travel on a transfer path to transfer articles, lie in that the transfer system further includes: a specific vehicle that performs a specific task while travelling on the transfer path at a speed lower than that of the transfer vehicles; and a congestion determination unit that determines whether or not there is congestion behind the specific vehicle, and upon the congestion determination unit determining that there is congestion, the specific vehicle suspends the task and performs evacuation travel to evacuate from a task point at which the specific vehicle was performing the task.

With this configuration, the specific vehicle performs the specific task while travelling at a speed lower than that of the transfer vehicles, and therefore it is easier to keep high work accuracy. If there is congestion behind the specific vehicle, the specific vehicle can suspend the task and perform evacuation travel. Therefore, it is possible to relatively swiftly restore a state in which the transfer vehicle that has been travelling behind the specific vehicle can travel at a normal travel speed, and alleviate the congestion.

Further features and advantages of the technology according to the present disclosure will become apparent from the following illustrative and non-limiting embodiments described with reference to the drawings.

BRIEF DESCRIPTION OF THE DRAWINGS

FIG. 10 is a flowchart showing a control procedure according to the second embodiment.

DETAILED DESCRIPTION OF PREFERRED EMBODIMENTS

1. First Embodiment

The following describes a first embodiment of a transfer system with reference to the drawings.

1-1. Mechanical Configuration of Transfer System

Figure 1:
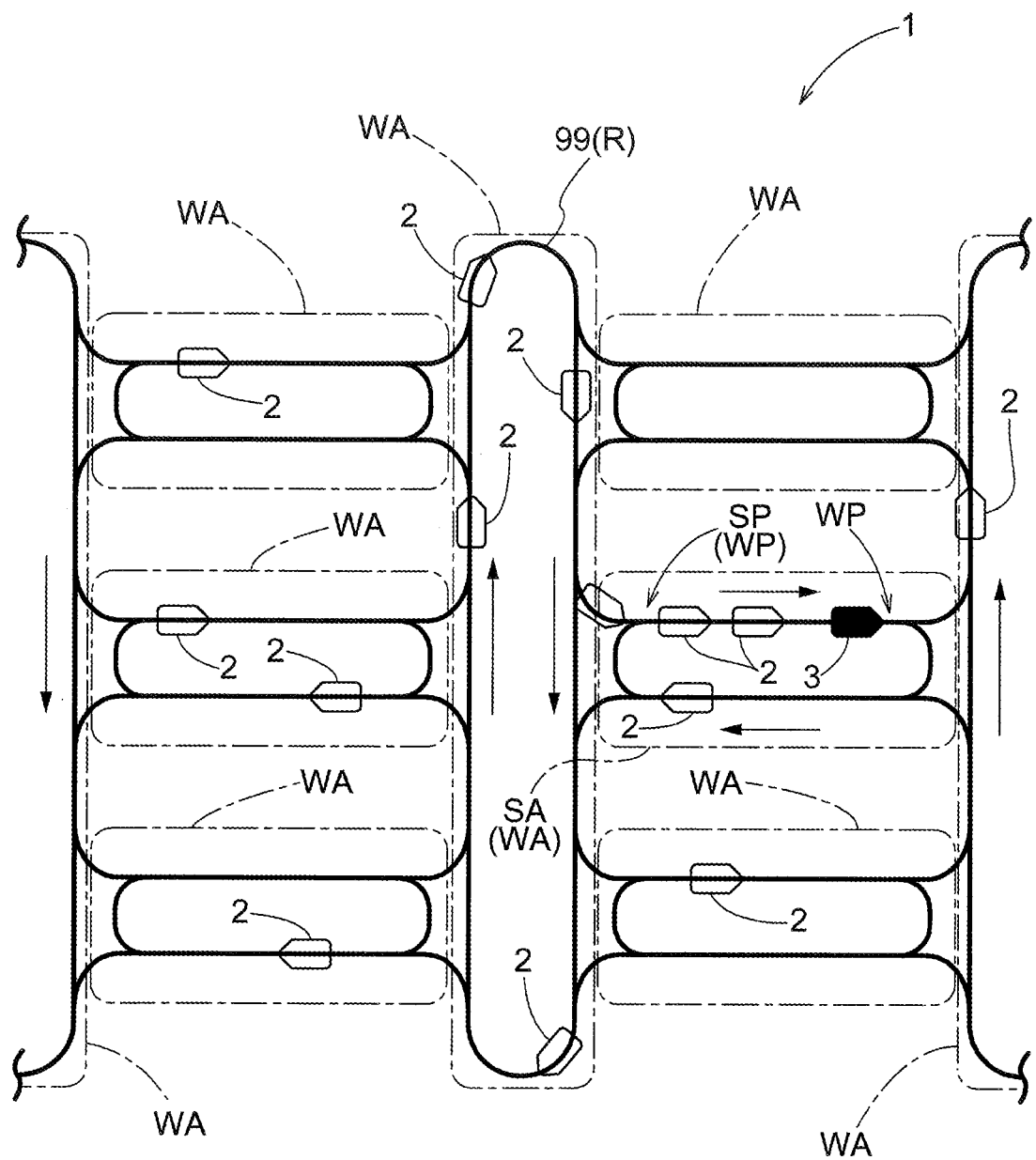
FIG. 1 is a schematic plan view showing an example of a layout of a transfer system.
Figure 2:
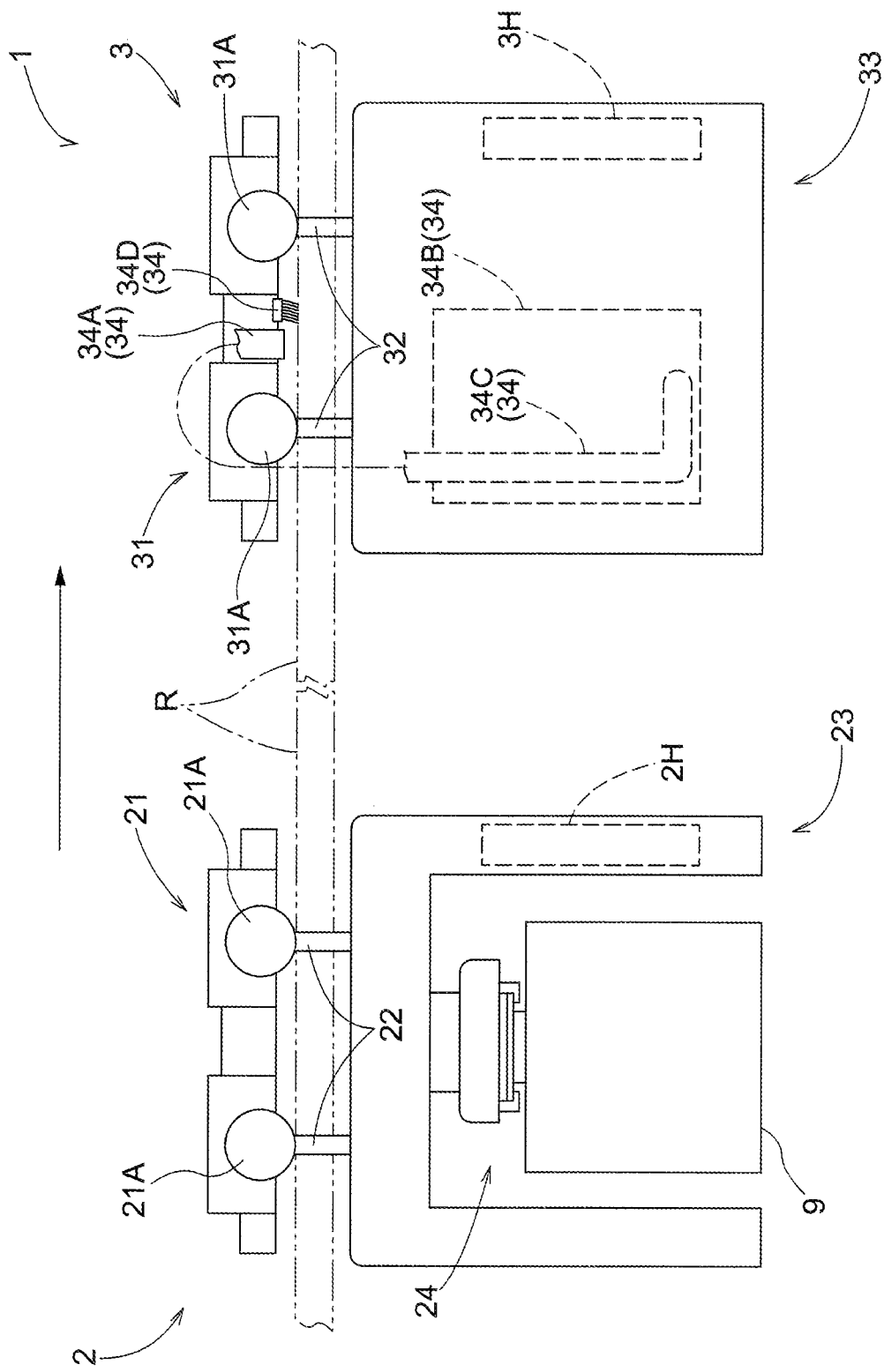
FIG. 2 is a schematic side view of a specific vehicle and a transfer vehicle.

As shown in FIG. 1, a transfer system 1 includes a plurality of transfer vehicles 2 that travel on a transfer path 99 to transfer articles 9 (see FIG. 2). The transfer vehicles 2 transfer articles 9 to various places. The articles 9 that are to be transferred are, for example, containers (Front Opening Unified Pod; FOUP) that store semiconductor wafers. If this is the case, the transfer vehicles 2 transfer the articles 9 to a processing device for processing semiconductor substrates, a storehouse for temporarily storing uncompleted products, and so on. The following describes an example in which the transfer system 1 is applied to a semiconductor manufacturing facility.

The transfer path 99 is set using a travel rail R that is provided extending along a ceiling, and the transfer vehicles 2 are configured to travel along the travel rail R, thereby travelling along the transfer path 99.

As shown in FIG. 2, each transfer vehicle 2 includes a travel unit 21, a body portion 23, and coupling portions 22 that couple the travel unit 21 and the body portion 23 to each other. The travel unit 21 is located above the travel rail R. The body portion 23 is coupled to the travel unit 21 by the coupling portions 22, and is located below the travel rail R.

The travel unit 21 is provided with a plurality of wheels 21A that roll on the travel rail R. In this example, the plurality of wheels 21A are provided on the left and right of the front and rear of the travel unit 21, and thus four wheels 21A are provided in total. At least one of the plurality of wheels 21A is driven by a travel motor (not shown) and rolls on the travel rail R.

The body portion 23 is provided with a transfer device 24 for transferring an article 9. The transfer device 24 transfers an article 9 between the transfer vehicle 2 and a transfer target place (a processing device, a storehouse, etc.). Although not described in detail, the transfer device 24 is provided with a gripping portion for gripping an article 9, a lifting/lowering portion for lifting/lowering an article 9 from/to a transfer target place that is located below the travel rail R, and a pivoting portion for changing the orientation of an article 9 to an appropriate orientation that is suitable for a transfer target place, as necessary. However, the transfer device 24 need only be provided with components for transferring an article 9 to/from a transfer target place, and is not limited to the above-described configuration.

Figure 3:
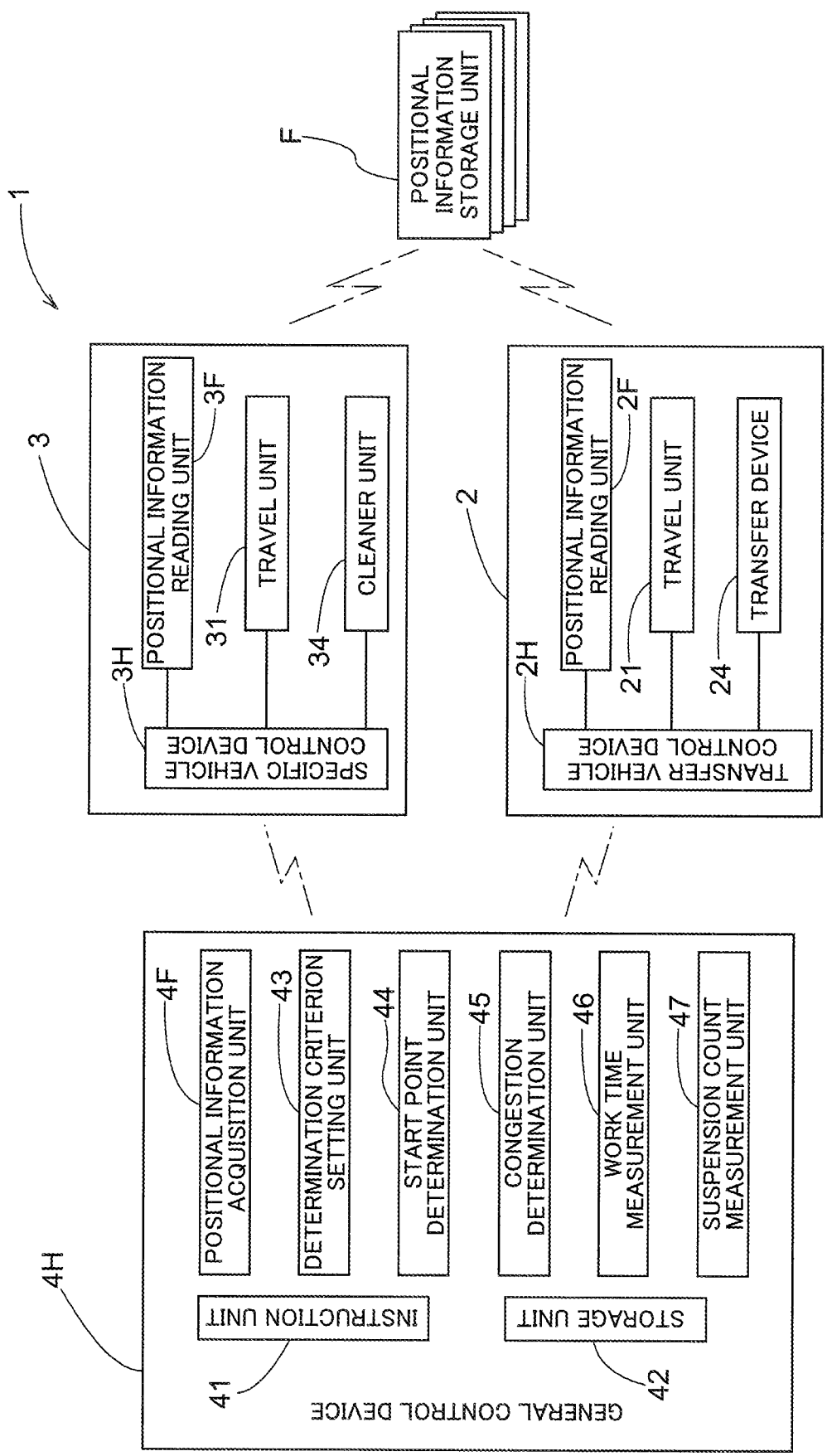
FIG. 3 is a control block diagram for the transfer system.

As shown in FIG. 3, each transfer vehicle 2 is provided with a positional information reading unit 2F for reading, from positional information storage units F provided at various positions on or near the transfer path 99, positional information regarding the various positions. Thus, the transfer vehicle 2 can keep track of its own current position. Note that the positional information storage units F may be formed using barcodes or wireless tags. If the positional information storage units F are formed using barcodes, the positional information reading unit 2F is preferably formed as a barcode reader, and if the positional information storage units F are formed as wireless tags, the positional information reading unit 2F is preferably formed as a tag reader.

As shown in FIG. 1, the transfer system 1 includes a specific vehicle 3 that performs a specific task while travelling on the transfer path 99 at a speed lower than that of the transfer vehicles 2. In the present embodiment, a plurality of work areas WA are set on the transfer path 99, and the specific vehicle 3 performs the specific task in each work area WA. Note that the work areas WA may be set in any area, and are not limited to the example shown in the drawing. The number of specific vehicles 3 travelling on the transfer path 99 may be set to any number, but is preferably set to a number that is at most smaller than the number of transfer vehicles 2. In the example shown in the drawing, the transfer system 1 includes one specific vehicle 3 to a plurality of transfer vehicles 2.

Here, in this description, the "specific task" is a task other than the task of transferring an article 9, and may be a cleaning task, which is the task of cleaning the travel rail R, an image capturing task, which is performed to create a map of the transfer path 99 or specifying an area in the facility that requires maintenance, and so on. In the present embodiment, the specific task is a cleaning task for cleaning the travel rail R, and the specific vehicle 3 is configured as a cleaning vehicle that performs the cleaning task. The specific vehicle 3 performs a cleaning task for removing dust or the like attached to the travel rail R. In the following description, the cleaning task, which is the specific task, may simply be referred to as the "specific task".

As shown in FIG. 2, the specific vehicle 3 includes a travel unit 31, a body portion 33, and coupling portions 32 that couple the travel unit 31 and the body portion 33 to each other. The travel unit 31 is located above the travel rail R. The body portion 33 is coupled to the travel unit 31 by the coupling portions 32, and is located below the travel rail R.

The travel unit 31 is provided with a plurality of wheels 31A that roll on the travel rail R. In this example, the plurality of wheels 31A are provided on the left and right of the front and rear of the travel unit 31, and thus four wheels 31A are provided in total. At least one of the plurality of wheels 31A is driven by a travel motor (not shown) and rolls on the travel rail R.

As shown in FIG. 3, the specific vehicle 3 is provided with a positional information reading unit 3F for reading, from positional information storage units F provided at various positions on or near the transfer path 99, positional information regarding the various positions. Thus, the specific vehicle 3 can keep track of the current position of itself. As described above, the basic configuration of the specific vehicle 3 is generally the same as that of the transfer vehicles 2.

Here, the specific vehicle 3 further includes a cleaner unit 34. Thus, the specific vehicle 3 is configured to be able to clean the travel rail R by using the cleaner unit 34.

As shown in FIG. 2, the cleaner unit 34 includes a nozzle portion 34A that sucks dust or the like on the travel rail R, and a suction force generator 34B that generates a suction force of the nozzle portion 34A. In the example shown in the drawing, the nozzle portion 34A is provided on the travel unit 31, and is connected to the suction force generator 34B by a hose portion 34C. Also, in the example shown in the drawing, the suction force generator 34B is provided in the body portion 33. However, the suction force generator 34B is not limited to such a configuration, and may be provided in the travel unit 31. The suction force generator 34B includes, for example, a motor and a pump that is driven by the motor.

In the present embodiment, the cleaner unit 34 further includes a brush portion 34D for removing dust or the like attached to the travel rail R from the travel rail R. In the example shown in the drawing, the brush portion 34D is provided on the travel unit 31, and is located at a position that is forward of the nozzle portion 34A in a travel direction of the specific vehicle 3, so as to be adjacent to the nozzle portion 34A. With this configuration, before the nozzle portion 34A sucks dust or the like attached to the travel rail R, dust or the like is removed from the travel rail R, and is thus brought into a state in which it can be easily sucked.

1-2. Configuration for Control by Transfer System

As shown in FIG. 3, the transfer system 1 includes a general control device 4H that controls the overall system, transfer vehicle control devices 2H that control operations of the transfer vehicles 2, and a specific vehicle control device 3H that controls operations of the specific vehicle 3. The transfer vehicle control devices 2H are respectively provided in the plurality of transfer vehicles 2. The specific vehicle control device 3H is provided in the specific vehicle 3. Each of these control devices includes, for example, a processor such as a microcomputer and peripheral circuits such as a memory. These pieces of hardware and programs that are executed in a processor such as a computer cooperate to realize various functions.

The general control device 4H is configured to be able to communicate with the transfer vehicle control devices 2H and the specific vehicle control device 3H. The general control device 4H includes an instruction unit 41 that gives various instructions to the transfer vehicle control devices 2H (the transfer vehicles 2) and the specific vehicle control device 3H (the specific vehicle 3). For example, the general control device 4H gives a transfer instruction, which is an instruction to transfer an article 9, to a transfer vehicle control device 2H (a transfer vehicle 2), and a work instruction, which is an instruction to perform a specific task, to the specific vehicle control device 3H (the specific vehicle 3).

The general control device 4H includes a storage unit 42 that stores various kinds of information. The storage unit 42 stores, for example, the date at which the specific task was performed, for each of the plurality of work areas WA. Also, in the present embodiment, the storage unit 42 stores at least a congestion determination criterion, a determination start threshold value Tt, and a suspension threshold value Nt, which will be described later.

The general control device 4H includes a positional information acquisition unit 4F that acquires, from the transfer vehicle control devices 2H (the transfer vehicles 2) and the specific vehicle control device 3H (the specific vehicle 3), the current positions of the corresponding transfer vehicle 2 and the specific vehicle 3. Thus, the general control device 4H can keep track of the current positions of the transfer vehicles 2 and the specific vehicle 3 on the transfer path 99.

The general control device 4H includes a start point determination unit 44 for determining a start point SP from which the specific task is started. In this example, if an upstream direction and a downstream direction are defined based on the travel direction of the transfer vehicles 2 and the specific vehicle 3, any one of the most upstream points in the plurality of work areas WA is determined as the start point SP. In the present embodiment, based on the date at which the specific task was performed, stored in the storage unit 42 for each of the plurality of work areas WA, the start point determination unit 44 calculates, for each of the plurality of work areas WA, a time period that has elapsed from the date to the current time. Then, from among a plurality of work areas WA, the start point determination unit 44 determines, as a start area SA, a work area WA for which the time period that has elapsed from the time (date) at which the previous specific task was performed in the work area to the current time is long, and determines the most upstream point in the start area SA as the start point SP (see FIG. 1). Specifically, based on a reference period (e.g. one week) stored in the storage unit 42 in advance, the start point determination unit 44 extracts a work area WA for which the time period that has elapsed from when the previous specific task was performed in the work area to the current time is no less than the reference period PE. If one work area WA is extracted as a result, this work area WA is determined as the start area SA. If a plurality of work areas WA are extracted, the start point determination unit 44 determines, as the start area SA, a work area WA for which the time period that has elapsed from when the previous specific task was performed in the work area to the current time is the longest from among the extracted work areas WA. The general control device 4H gives a work instruction to the specific vehicle control device 3H (the specific vehicle 3) so that the specific vehicle control device 3H (the specific vehicle 3) starts the specific task at the start point SP. As a result, the overall system can efficiently perform the specific task.

The transfer system 1 includes a congestion determination unit 45 that determines whether or not there is congestion behind the specific vehicle 3. In this example, the general control device 4H includes the congestion determination unit 45. In the present embodiment, the congestion determination unit 45 determines whether there is congestion behind the specific vehicle 3 (hereinafter simply referred to as "congestion"), based on a congestion determination criterion.

Figure 4:
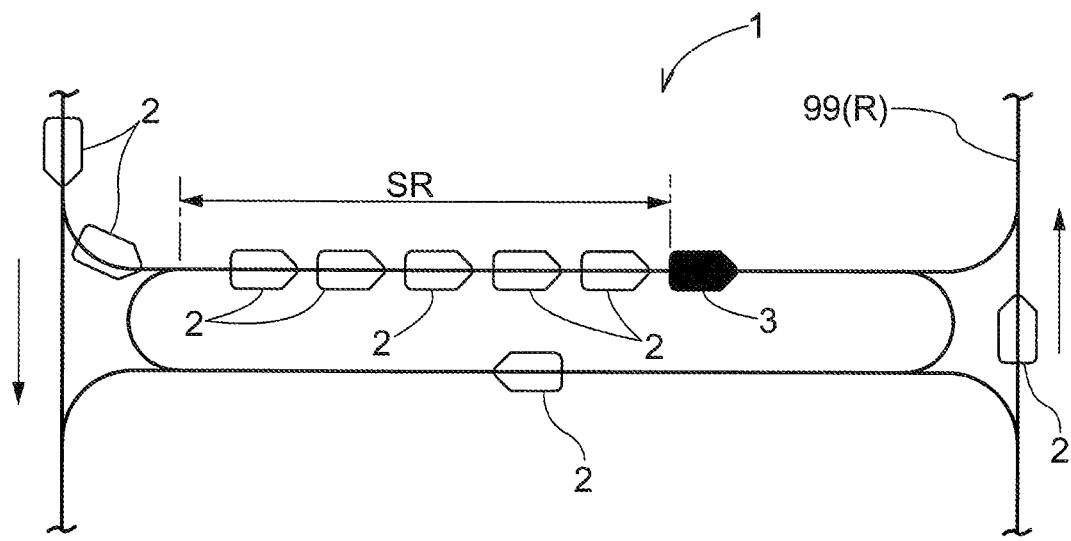
FIG. 4 is a diagram illustrating an example of a congestion determination criterion.

Here, the general control device 4H includes a determination criterion setting unit 43 for setting the congestion determination criterion, and the congestion determination criterion is set according to various parameters. In the present embodiment, as shown in FIG. 4, the congestion determination criterion is that the number of transfer vehicles 2 that are present in a set area SR, which is set rearward of the specific vehicle 3, is no less than a set number SN. FIG. 4 shows an example in which the set number SN is five. If the congestion determination criterion is satisfied, i.e. if five or more transfer vehicles 2 are present in the set area SR in this example, the congestion determination unit 45 determines that there is congestion. As described above, the general control device 4H is configured to be able to keep track of the current positions of the transfer vehicles 2 on the transfer path 99, and therefore the general control device 4H is aware of the number of transfer vehicles 2 in the set area SR based on the current positions of the transfer vehicles 2. Preferably, the set area SR and the set number SN are appropriately set according to characteristics of the facility (e.g. the normal speed of the transfer vehicles 2).

It is also preferable that the congestion determination criterion is varied according to various situations. For example, in a case of a limited area, the larger the number of transfer vehicles 2 in the area is, the more likely that heavy congestion involving a large number of transfer vehicles 2 will occur. In the present embodiment, the congestion determination criterion is varied according to the number of transfer vehicles 2 in the work area WA in which the specific vehicle 3 is performing the specific task, such that the congestion determination unit 45 is more likely to determine that there is congestion when the number is large compared to when the number is small. For example, it is possible to vary the congestion determination criterion to increase the set area SR without changing the initial set number SN. Alternatively, it is possible to vary the congestion determination criterion to reduce the set number SN without changing the initial set area SR. As a result, it is possible to determine whether or not there is congestion in an early stage, before heavy congestion occurs, and it is possible to swiftly take countermeasures to alleviate congestion.

In this transfer system 1, if the congestion determination unit 45 determines that there is congestion, the specific vehicle 3 suspends the specific task and performs evacuation travel to evacuate from a work point WP at which the specific vehicle 3 was performing the specific task. In the present embodiment, the specific vehicle 3 performs evacuation travel upon receiving an evacuation travel instruction, after suspending the specific task upon receiving a work suspension instruction, which is an instruction to suspend the specific task, from the general control device 4H. Using the evacuation travel instruction, the general control device 4H instructs the specific vehicle 3 to, for example, travel along a path that is different from the travel path of the transfer vehicle 2 that travels behind the specific vehicle 3. Thus, it is possible to instruct the specific vehicle 3 to evacuate from the path ahead of the transfer vehicle 2, and allow the transfer vehicle 2 to travel at a normal speed (or a speed higher than the normal speed). As a result, it is possible to alleviate congestion. Here, if an evacuation path is provided in the transfer system 1 in addition to the transfer path 99, the specific vehicle 3 may travel along the evacuation path when performing evacuation travel. If the congestion determination unit 45 does not determine that there is congestion (determines that there is no congestion), the specific vehicle 3 continues the specific task.

In the present embodiment, the travel speed of the specific vehicle 3 during evacuation travel is set to be higher than the travel speed of the specific vehicle 3 when performing the specific task. Therefore, it is possible to increase the travel speed of the transfer vehicle 2 that travels behind the specific vehicle 3 when the specific vehicle 3 starts evacuation travel, and it is possible to more swiftly alleviate congestion.

Here, it is preferable that the upper limit of the travel speed of the specific vehicle 3 during evacuation travel is set within a range where there is no possibility of the nozzle portion 34A or the brush portion 34D of the cleaner unit 34 hitting the travel rail R hard and being damaged. For example, it is preferable that the upper limit of the travel speed of the specific vehicle 3 during evacuation travel is set to be approximately the same as a normal speed of the transfer vehicles 2 (e.g. a speed when the transfer vehicles 2 are transferring an article 9). Even with such a setting, it is possible to allow the transfer vehicle 2 that travels behind the specific vehicle 3 to travel at a normal speed.

It is also preferable that, for example, the nozzle portion 34A and the brush portion 34D of the cleaner unit 34 are configured to be retractable, and the cleaner unit 34 is configured to be switchable to a working state (a state in which the nozzle portion 34A and the brush portion 34D protrude toward the travel rail R) and a non-working state (a state in which the nozzle portion 34A and the brush portion 34D are retracted away from the travel rail R). If this is the case, it is preferable that the cleaner unit 34 is configured to be in a non-working state while the specific vehicle 3 is performing evacuation travel. With this configuration, it is possible to further increase the travel speed of the specific vehicle 3 during evacuation travel, while preventing the nozzle portion 34A and the brush portion 34D from, for example, being damaged by coming into contact with the travel rail R.

Figure 5:
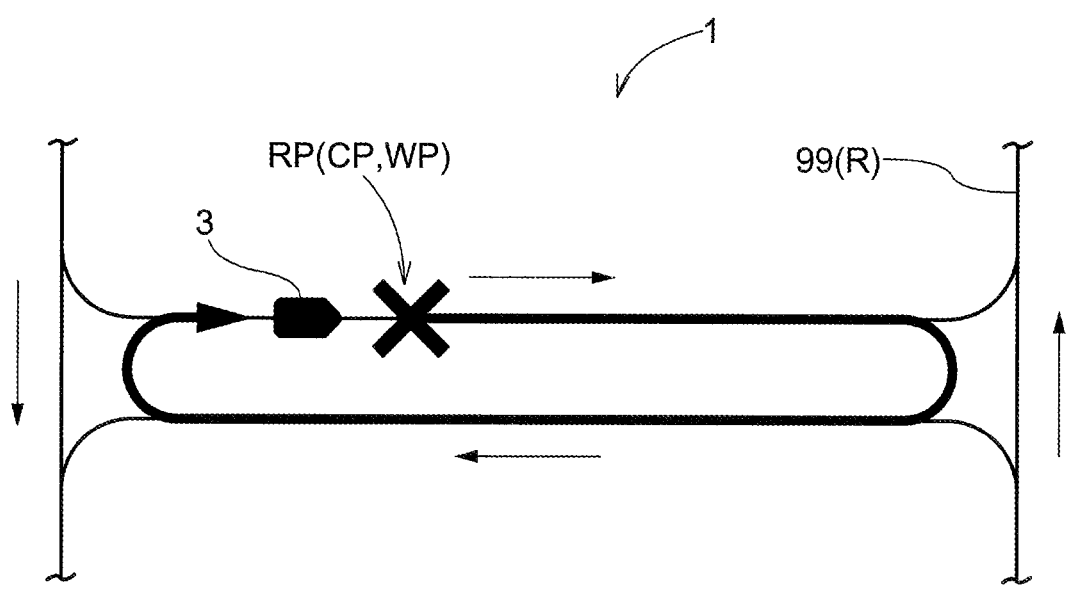
FIG. 5 is a diagram illustrating an example of a task start point after evacuation travel.

As shown in FIG. 5, in the present embodiment, the specific vehicle 3 performs evacuation travel, and thereafter returns to the work point WP (a suspension point CP), at which the specific vehicle 3 suspended the specific task, and resumes the specific task. In this example, in a case where the specific vehicle 3 has performed evacuation travel, the start point determination unit 44 determines the work point WP (the suspension point CP), at which the specific vehicle 3 suspended the specific task, as a resuming point RP at which the specific vehicle 3 is to resume the specific task.

The description above illustrates a case where the congestion determination unit 45 performs determination processing to determine whether or not there is congestion. However, in the present embodiment, the congestion determination unit 45 is configured to not perform determination processing to determine whether or not there is congestion until a duration T of the specific task exceeds a determination start threshold value Tt that has been set in advance. As described above, the determination start threshold value Tt is stored in the storage unit 42 included in the general control device 4H. Also, as shown in FIG. 3, in this example, the general control device 4H includes a work time measurement unit 46 for measuring the duration T of the specific task from when the specific task was started by the specific vehicle 3. Here, the duration T of the specific task measured by the work time measurement unit 46 is the duration of the specific task that is continuously performed in a single work area WA. The congestion determination unit 45 is configured to compare the determination start threshold value Tt stored in the storage unit 42 with the duration T of the specific task measured by the work time measurement unit 46, and not perform determination processing to determine whether or not there is congestion until the duration T exceeds the determination start threshold value Tt. Upon the duration T exceeding the determination start threshold value Tt, the congestion determination unit 45 performs determination processing to determine whether or not there is congestion. Note that the determination start threshold value Tt is a value indicating a period of time, and is set to an appropriate value. For example, the determination start threshold value Tt may be set to a value within the range of 30 seconds to 60 seconds.

Also, the description above illustrates a case where the specific vehicle 3 suspends the specific task and performs evacuation travel upon the congestion determination unit 45 determining that there is congestion. However, the present embodiment employs a configuration in which, even in a case where the congestion determination unit 45 determines that there is congestion, if a suspension count N, which is the number of times the specific task has been suspended, in a single work area WA has reached a suspension threshold value Nt that has been set in advance, the specific vehicle 3 continues the specific task in the work area WA. As described above, the suspension threshold value Nt is stored in the storage unit 42 included in the general control device 4H. Also, as shown in FIG. 3, in this example, the general control device 4H includes a suspension count measurement unit 47 for measuring the suspension count N of the specific task in a single work area WA. In this example, the suspension count measurement unit 47 is configured to, in a case where the specific task is suspended several times in a row in a single work area WA without the specific task being performed in another work area WA, increment the suspension count N of the specific task in the work area WA. In other words, after the specific task has been suspended in a given work area WA, if another work area WA is set as a priority work area PA and the specific task is to be resumed in the priority work area PA, the suspension count N of the specific task in the aforementioned work area WA, in which the specific task was suspended, is reset to the initial value (zero). However, the suspension count measurement unit 47 is not limited to such a configuration, and may be configured to increment the suspension count N at any time even if the specific task has not been suspended several times in a row in a single work area WA. With any of the above-described configurations, if the specific task has been completed in a single work area WA, the suspension count N in the work area WA is reset to the initial value (zero).

The general control device 4H is configured to compare the suspension threshold value Nt stored in the storage unit 42 with the suspension count N of the specific task in a single work area WA measured by the suspension count measurement unit 47, and not give a work suspension instruction to the specific vehicle 3 in a case where the suspension count N has reached the suspension threshold value Nt even if the congestion determination unit 45 has determined that there is congestion. In a case where the suspension count N has not reached the suspension threshold value Nt and the congestion determination unit 45 has determined that there is congestion, the general control device 4H gives a work suspension instruction and an evacuation travel instruction to the specific vehicle 3. Note that the suspension threshold value Nt is a value that indicates the number of times of suspension (a natural number), and is preferably set to an appropriate value. For example, the suspension threshold value Nt may also be set to a value within a range of five to ten.

Figure 6:
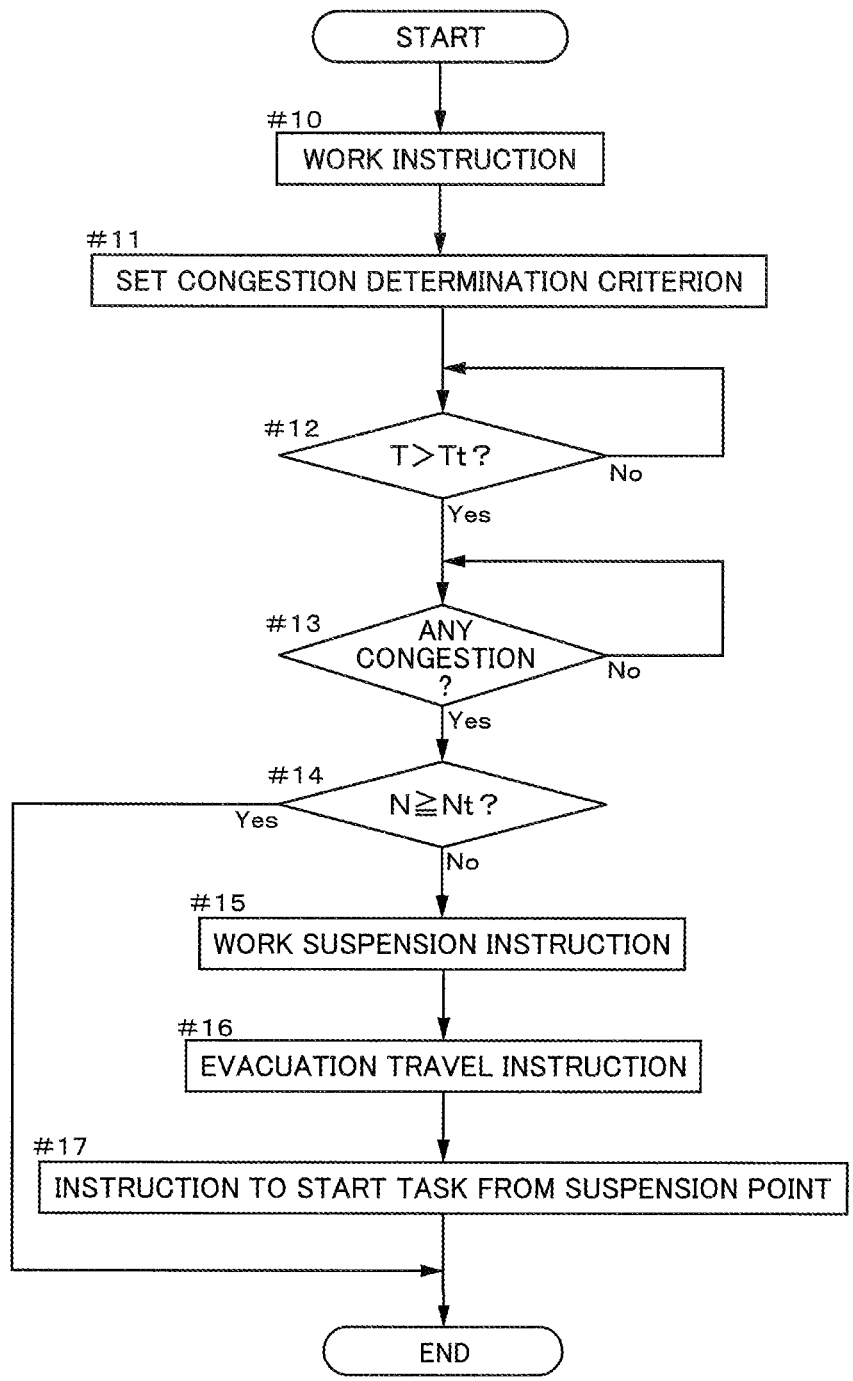
FIG. 6 is a flowchart showing a control procedure.

Next, the following describes a control procedure performed in the transfer system 1 with reference to the flowchart shown in FIG. 6.

The general control device 4H gives a work instruction to the specific vehicle 3 to cause the specific vehicle 3 to perform the specific task (#10). As described above, from among a plurality of work areas WA, a work area WA for which the time period that has elapsed from the time (date) at which the previous specific task was performed in the work area to the current time is long is determined as a start area SA in which the specific task is to be performed. After giving the work instruction to the specific vehicle 3, the general control device 4H sets the congestion determination criterion (#11). In this example, the set area SR that is rearward of the specific vehicle 3 and the set number SN of transfer vehicles 2 in the set area SR are set based on the number of transfer vehicles 2 in the selected work area WA. Note that the order in which a work instruction is given to the specific vehicle 3 and the congestion determination criterion is set may be reversed.

The general control device 4H sets the congestion determination criterion, and thereafter determines whether or not the duration T of the specific task has exceeded the determination start threshold value Tt (#12). The general control device 4H does not determine whether or not there is congestion and the specific task will be continued until the duration T of the specific task exceeds the determination start threshold value Tt (#12; No). If it is determined that the duration T of the specific task has exceeded the determination start threshold value Tt (#12; Yes), the general control device 4H determines whether or not there is congestion behind the specific vehicle 3 (#13). Whether or not there is congestion is determined by the congestion determination unit 45 based on the congestion determination criterion. If it is determined that there is no congestion (#13; No), the specific task is continued and whether or not there is congestion is repeatedly determined at regular intervals.

If it is determined that there is congestion (#13; Yes), the general control device 4H determines whether or not the current specific task suspension count N of the work area WA in which the specific task is being performed has reached the suspension threshold value Nt (#14). If it is determined that the suspension count N has reached the suspension threshold value Nt (#14; Yes), the specific task is continued.

In a case where it is determined that there is congestion (#13; Yes) and the suspension count N has not reached the suspension threshold value Nt (#14; No), the general control device 4H gives a work suspension instruction to the specific vehicle 3 to suspend the specific task (#15) and gives an evacuation travel instruction to the specific vehicle 3 to cause the specific vehicle 3 to evacuate from the work point WP (the suspension point CP) (#16).

After giving the work suspension instruction and the evacuation travel instruction to the specific vehicle 3 (#15 and #16), the general control device 4H determines the work point WP (the suspension point CP) at which the specific task was suspended, as the resuming point RP at which the specific task is to be resumed, and issues an instruction to perform the specific task at the resuming point RP (the suspension point CP) (#17).

2. Second Embodiment

The following describes a second embodiment of the transfer system 1. The present embodiment is different from the first embodiment in the configuration for control. The following mainly describes points that differ from the above-described first embodiment. Points that are not specifically described are the same as those in the above-described first embodiment.

Figure 7:
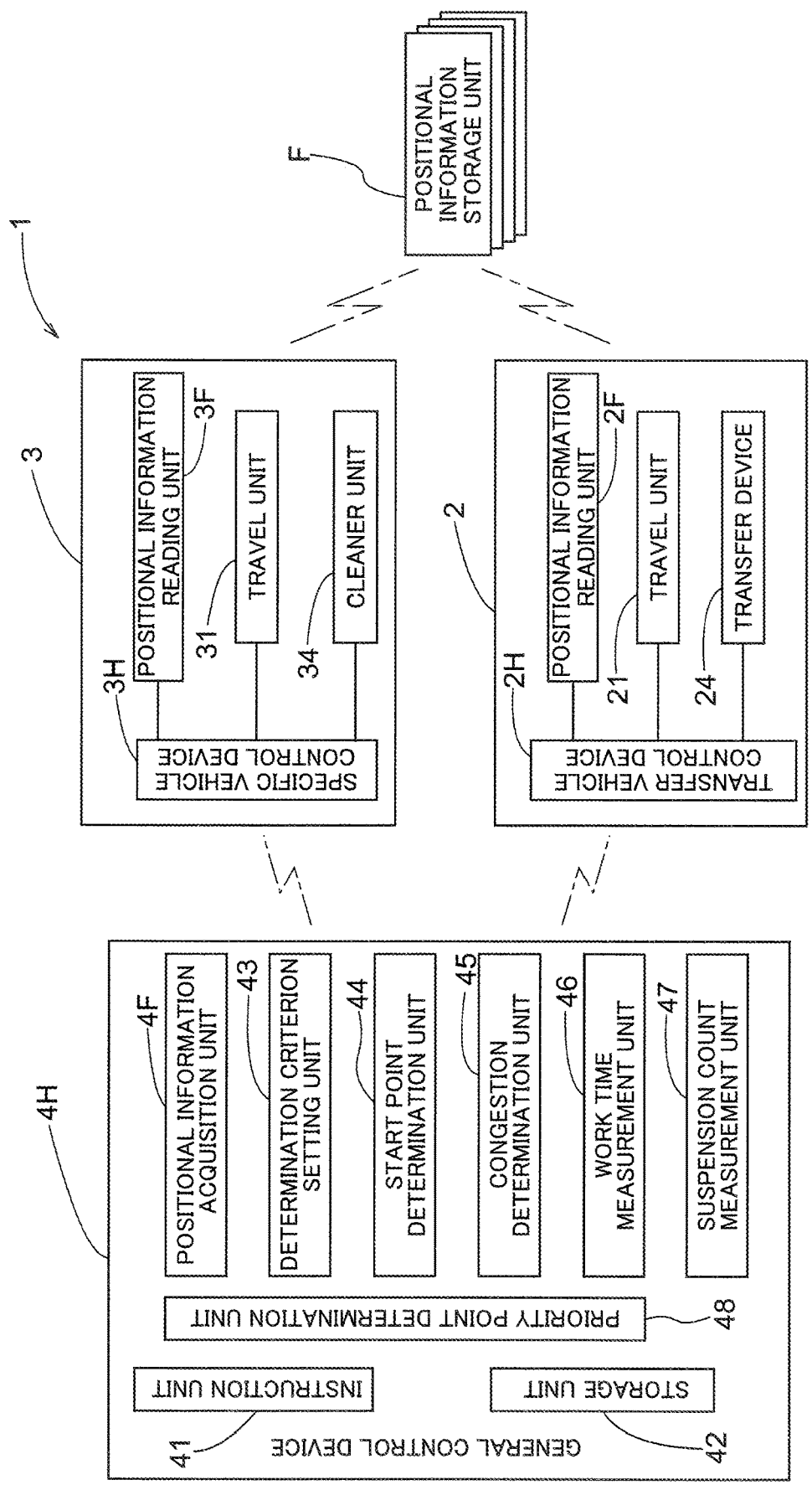
FIG. 7 is a control block diagram for a transfer system according to a second embodiment.
Figure 8:
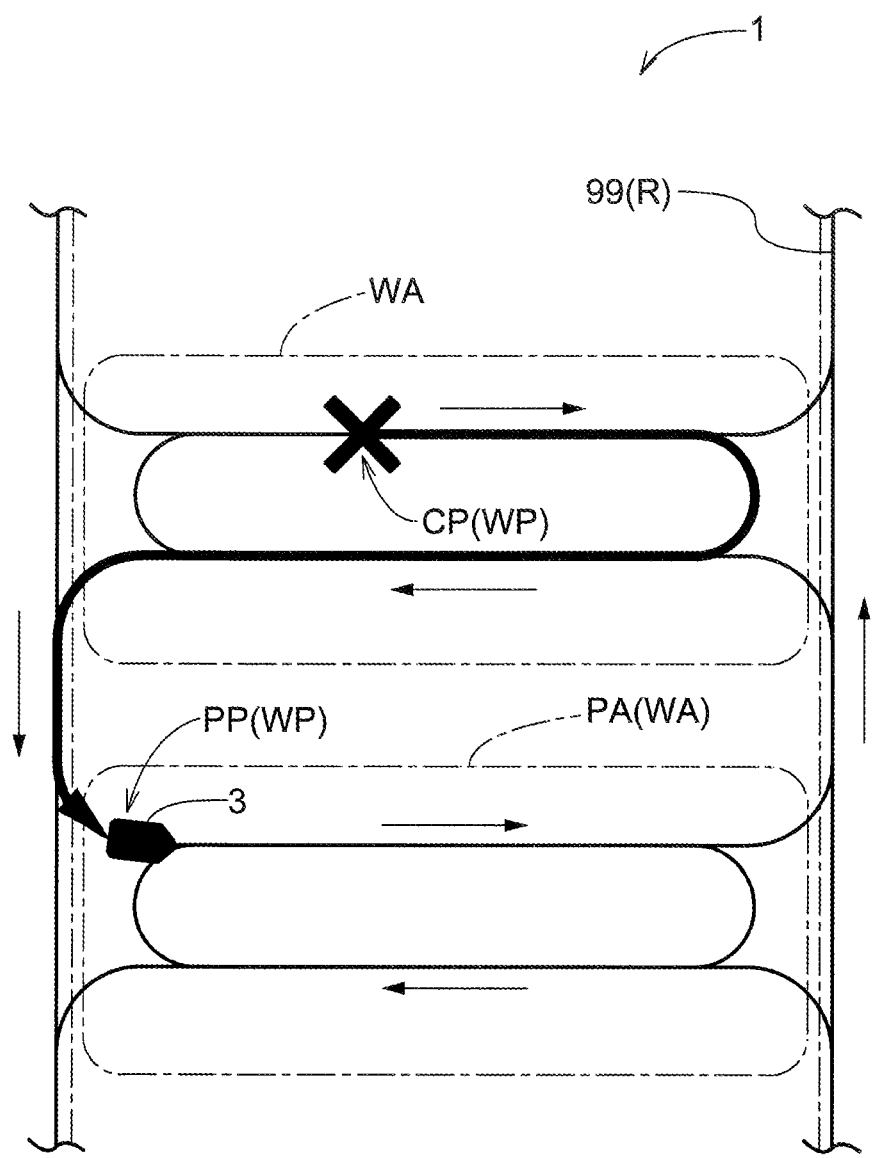
FIG. 8 is a diagram illustrating an example of a task start point after evacuation travel according to the second embodiment.

As shown in FIG. 7, in the present embodiment, the general control device 4H includes a priority point determination unit 48 for determining a priority point PP at which the specific task is to be preferentially performed. In this example, after the specific vehicle 3 has performed evacuation travel, the priority point determination unit 48 determines whether or not there is a priority point PP at which the specific task is to be performed prior to the task being performed at the work point WP (the suspension point CP) at which the specific task was suspended. If the priority point determination unit 48 determines that there is a priority point PP that is to be given a higher priority than the suspension point CP, the specific vehicle 3, after performing evacuation travel, moves to the priority point PP and starts the specific task as shown in FIG. 8. Thus, the work efficiency of the specific task that is performed by the specific vehicle 3 can be improved in the overall system.

Figure 9:
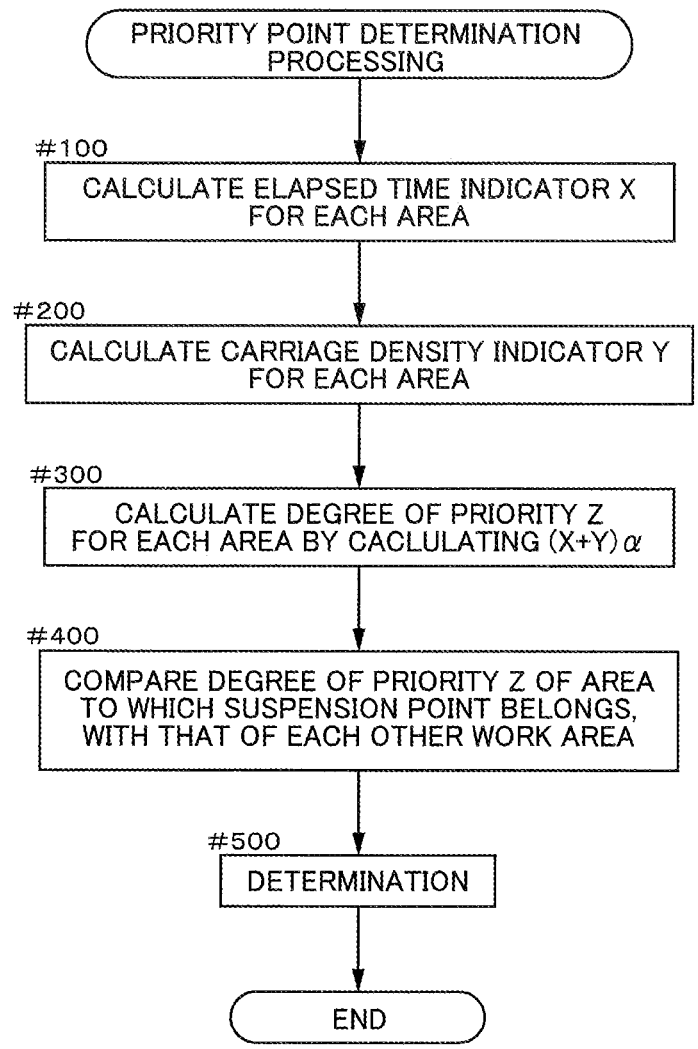
FIG. 9 is a flowchart showing an example of a processing procedure for executing priority point determination processing.

The priority point determination unit 48 executes priority point determination processing to determine whether or not there is a priority point PP. FIG. 9 is a flowchart showing an example of a processing procedure for executing priority point determination processing.

As shown in FIG. 9, in the priority point determination processing according to the present embodiment, first, the priority point determination unit 48 calculates an elapsed time indicator X, which is an indicator corresponding to the time period that has elapsed from when the previous specific task was performed to the current time, for each of the work areas WA (#100). The elapsed time indicator X is calculated such that the longer the time period that has elapsed from when the previous specific task was performed to the current time is, the higher the elapsed time indicator X is. That is, the higher the value of the elapsed time indicator X is (the longer the elapsed period is), the higher the priority of the specific task is. For example, it is possible to employ a setting in which the value of the elapsed time indicator X is incremented by "1" each time the elapsed period of time from the previous specific task has increased by "1 day".

The priority point determination unit 48 also calculates, for each work area WA, a carriage density indicator Y, which is an indicator corresponding to the density of transfer vehicles 2 in the work area WA (#200). Here, the density of transfer vehicles 2 can be expressed as the number of transfer vehicles 2 per unit path length in each work area WA. The carriage density indicator Y is calculated such that the lower the density of transfer vehicles 2 is, the higher the value of the carriage density indicator Y is. That is, the higher the value of the carriage density indicator Y is (the lower the carriage density is), the higher the priority of the specific task is. For example, it is possible to employ a setting in which the inverse of the number of transfer vehicles 2 per unit path length "10 m" is the carriage density indicator Y.

Also, in the present embodiment, the priority point determination unit 48 calculates a degree of priority Z by multiplying the sum of the elapsed time indicator X and the carriage density indicator Y by a suspension point priority coefficient α (#300). The degree of priority Z is calculated for each work area WA. Here, the suspension point priority coefficient α is set to be "a value (a real number) greater than 1" for a work area WA in which the specific task has been suspended in the past and the specific task has not been completed, and is set to be "1" for a work area WA in which the specific task has never been suspended in the past, or a work area WA in which the specific task has been suspended in the past, but the specific task was completed thereafter. As a result, it is more likely that a work area WA in which the specific task has been suspended in the past and the specific task has not been completed overall is selected as a priority point PP.

After the degree of priority Z has been calculated for each work area WA, the priority point determination unit 48 compares the degree of priority Z of the work area WA to which the suspension point CP at which the specific task has been suspended immediately before priority point determination processing has been performed belongs, with the degree of priority Z of each of the other work areas WA (#400). Thus, whether or not there is a priority point PP is determined (#500). Specifically, if there is a work area WA of which the degree of priority Z is higher than the degree of priority Z of the work area WA to which the suspension point CP at which the specific task was suspended immediately before priority point determination processing was performed belongs, the work area WA with a higher degree of priority Z is determined as the priority work area PA (see FIG. 8). Note that, if there are a plurality of work areas WA of which the degree of priority Z is higher than the degree of priority Z of the work area WA to which the suspension point CP belongs, the work area WA with the highest degree of priority Z from among them is determined as the priority work area PA.

If the degree of priority Z of the work area WA to which the suspension point CP belongs is the highest, the suspension point CP is determined as the resuming point RP from which the specific task is to be started again. If a work area WA other than the work area WA to which the suspension point CP belongs is determined as the priority work area PA, the resuming point RP is determined in the following manner. That is, in a priority work area PA, if the specific task has never been suspended in the past, or if the specific task has been suspended in the past, but the specific task has been completed thereafter, the most upstream point in the priority work area PA is determined as the priority point PP, and the priority point PP is determined as the resuming point RP. On the other hand, although not depicted, in a priority work area PA, if the specific task has been suspended in the past, and the specific task has not been completed in the priority work area PA, the suspension point CP at which the specific task has been suspended in the past is determined as the priority point PP, and the priority point PP is determined as the resuming point RP. Note that transfer vehicles 2 that travel in work areas WA are omitted from FIG. 8.

Next, the following describes a control procedure performed in the present embodiment with reference to the flowchart shown in FIG. 10. Note that steps #20 to #26 in the present embodiment shown in FIG. 10 are the same as steps #10 to #16 in the first embodiment shown in FIG. 6, and therefore descriptions thereof will be omitted. The following describes a processing procedure performed after step #26 in the present embodiment.

As shown in FIG. 10, after giving the evacuation travel instruction to the specific vehicle 3 (#26), the general control device 4H performs priority point determination processing to determine whether or not there is a priority point PP that is to be given a higher priority than the suspension point CP (#27). Upon executing priority point determination processing, if the general control device 4H determines that there is no priority point PP (#28; No), the general control device 4H gives the specific vehicle 3 a work instruction indicating that the specific task is to be performed from the suspension point CP, which is determined as the resuming point RP (#29). Upon executing priority point determination processing, if the general control device 4H determines that there is a priority point PP (#28; Yes), the general control device 4H gives the specific vehicle 3 a work instruction indicating that the specific task is to be performed from the priority point PP, which is determined as the resuming point RP (#30).

3. Other Embodiments

The following describes other embodiments of the transfer system 1.

(1) Each of the embodiments above describes an example in which the travel speed of the specific vehicle 3 during evacuation travel is set to be higher than the travel speed of the specific vehicle 3 when performing the specific task. However, the present invention is not limited to such an example, and the travel speed of the specific vehicle 3 during evacuation travel may be approximately the same as the travel speed of the specific vehicle 3 when performing the specific task.

(2) Each of the embodiments above describes an example in which the determination start threshold value Tt is set. The determination start threshold value Tt is used as a reference for determining whether or not to perform determination processing to determine whether or not there is congestion, based on the duration T of the specific task. However, the present invention is not limited to such an example, and the determination start threshold value Tt may not be set. If this is the case, if the congestion determination criterion is satisfied, the congestion determination unit 45 determines whether or not there is congestion, regardless of the duration T of the specific task.

(3) Each of the embodiments above describes an example in which the suspension threshold value Nt is set. The suspension threshold value Nt is used as a reference for determining whether or not to suspend the specific task, based on the suspension count N of the specific task in a single work area WA. However, the present invention is not limited to such an example, and the suspension threshold value Nt may not be set. If this is the case, if the congestion determination unit 45 determines that there is congestion, the specific vehicle 3 suspends the specific task and performs evacuation travel, regardless of the suspension count N of the specific task in the work area WA.

(4) Each of the embodiments above describes an example in which the congestion determination criterion is varied according to the number of transfer vehicles 2 in the work area WA in which the specific vehicle 3 performs the specific task. However, the present invention is not limited to such an example, and the congestion determination criterion may be fixed as a predetermined criterion. Alternatively, the congestion determination criterion may be varied according to a criterion other than the number of transfer vehicles 2 in the work area WA. For example, the congestion determination criterion may be varied based on the time period that has elapsed from the date at which the previous specific task was performed in any of the work areas WA to the current time, such that if the time period that has elapsed is long, it is less likely that it is determined that there is congestion, compared to when the time period that has elapsed is short.

(5) The first embodiment above describes an example in which, from among a plurality of work areas WA, a work area WA for which the time period that has elapsed from the time (date) at which the previous specific task was performed in the work area to the current time is long is determined as the start area SA, and the most upstream point in the start area SA is determined as the start point SP. However, the present invention is not limited to such an example. If the plurality of work areas WA include a work area WA in which the specific task was suspended in the previous execution period and has not been completed, the work area WA may be determined as the start area SA, and the suspension point CP at which the previous specific task was suspended may be determined as the start point SP.

(6) The embodiments above describe an example in which the specific vehicle 3 is configured as a cleaning vehicle. However, the present invention is not limited to such an example, and the specific vehicle 3 may have both the function of transferring articles 9 and the function of cleaning the travel rail R. In other words, any of the plurality of transfer vehicles 2 may be configured as a specific vehicle 3 that has the function of cleaning the travel rail R. Also, as described above, the specific task performed by the specific vehicle 3 is not limited to a cleaning task, and may be another task such as an image capturing task, which is the task of capturing an image while moving along the travel rail R, or an inspection task for detecting a foreign object or an abnormality.

(7) The embodiments above describe an example in which the transfer vehicles 2 and the specific vehicle 3 are configured to travel along the travel rail R that is provided along the ceiling. However, the present invention is not limited to such an example. The transfer vehicles 2 and the specific vehicle 3 may be, for example, automated guided vehicles that travel on the floor.

(8) Note that the configurations disclosed in the embodiments above may be employed in combination with the configurations disclosed in Other Embodiments unless inconsistency occurs. Also, regarding the other configurations, the embodiments disclosed in the present description are mere examples in all aspects. Therefore, various modifications can be made without departing from the spirit of the present disclosure.

4. Summary of Embodiments Above

The following is a summary of the above-described transfer system.

The transfer system is a transfer system including a plurality of transfer vehicles that travel on a transfer path to transfer articles, the transfer system further including: a specific vehicle that performs a specific task while travelling on the transfer path at a speed lower than that of the transfer vehicles; and a congestion determination unit that determines whether or not there is congestion behind the specific vehicle, wherein, upon the congestion determination unit determining that there is congestion, the specific vehicle suspends the task and performs evacuation travel to evacuate from a task point at which the specific vehicle was performing the task.

With this configuration, the specific vehicle performs the specific task while travelling at a speed lower than that of the transfer vehicles, and therefore it is easier to keep high work accuracy. If there is congestion behind the specific vehicle, the specific vehicle can suspend the task and perform evacuation travel. Therefore, it is possible to relatively swiftly restore a state in which the transfer vehicle that was travelling behind the specific vehicle can travel at a normal travel speed, and alleviate the congestion.

Here, it is preferable that, after performing the evacuation travel, the specific vehicle returns to the task point at which the specific vehicle suspended the task, and resumes the task.

With this configuration, after performing evacuation travel to alleviate the congestion, the specific vehicle can resume the task from the task point at which the task was suspended. Thus, it is possible to relatively swiftly complete the task initially scheduled in the task area, while alleviating the congestion.

It is also preferable that the transfer system further includes a priority point determination unit that determines whether or not there is a priority point at which the task is to be performed prior to the task being performed at the task point at which the task was suspended, and upon the priority point determination unit determining that there is a priority point, the specific vehicle moves to the priority point after performing the evacuation travel, and starts the task.

With this configuration, the specific vehicle can move to the priority point through evacuation travel that is performed to alleviate congestion. Thus, the work efficiency of the specific task that is performed by the specific vehicle can be improved in the overall system.

It is also preferable that the travel speed of the specific vehicle during the evacuation travel is higher than the travel speed of the specific vehicle when performing the task.

With this configuration, it is possible to increase the travel speed of the transfer vehicle that travels behind the specific vehicle upon the specific vehicle starting evacuation travel. Thus, it is possible to relatively swiftly alleviate the congestion.

It is also preferable that the congestion determination unit does not perform determination processing to determine whether or not there is congestion until the duration of the task exceeds a predetermined determination start threshold value.

With this configuration, it is possible to prevent the task performed by the specific vehicle from being suspended immediately after being started. Therefore, it is possible to avoid a situation where the specific vehicle barely performs the task and only repeats evacuation travel.

It is also preferable that a plurality of task areas are set on the transfer path, and upon the number of times the task is suspended in one of the task areas reaching a predetermined suspension threshold value, the specific vehicle continues the task until the task in the one of the task areas is completed even when the congestion determination unit has determined that there is congestion.

With this configuration, it is possible to prevent the task performed by the specific vehicle in one task area from being repeatedly suspended a certain number of times or more, the certain number of times corresponding to the suspension threshold value. Therefore, it is possible to avoid a situation where the task in each work area will not be completed regardless of time, while alleviating congestion caused by the specific vehicle.

It is also preferable that a plurality of task areas are set on the transfer path, and a congestion determination criterion is varied according to the number of transfer vehicles in the task area in which the specific vehicle is performing the task, such that the congestion determination unit is more likely to determine that there is congestion when the number is large, compared to when the number is small.

When the number of transfer vehicles in a work area is large, heavy congestion involving a large number of transfer vehicles is more likely to occur, compared to when the number of transfer vehicles is small. With this configuration, it is more likely to be determined that there is congestion when the number of transfer vehicles in a work area is large, and therefore the specific vehicle can perform evacuation travel in an early stage, before heavy congestion occurs. Thus, it is possible to more effectively perform control to alleviate congestion.

The invention claimed is:

1. A transfer system comprising a plurality of transfer vehicles that travel on a transfer path to transfer articles, the transfer system further comprising:
   a specific vehicle that performs a specific task while travelling on the transfer path at a speed lower than that of the transfer vehicles; and
   a congestion determination unit that determines whether or not there is congestion behind the specific vehicle,
   wherein, upon the congestion determination unit determining that there is congestion, the specific vehicle suspends the task and performs evacuation travel to evacuate from a task point at which the specific vehicle was performing the task.

2. The transfer system according to claim 1, wherein, after performing the evacuation travel, the specific vehicle returns to the task point at which the specific vehicle suspended the task, and resumes the task.

3. The transfer system according to claim 2, further comprising:
   a priority point determination unit that determines whether or not there is a priority point at which the task is to be performed prior to the task being performed at the task point at which the task was suspended, and
   wherein, upon the priority point determination unit determining that there is a priority point, the specific vehicle moves to the priority point after performing the evacuation travel, and starts the task.

4. The transfer system according to claim 1, further comprising:
   a priority point determination unit that determines whether or not there is a priority point at which the task is to be performed prior to the task being performed at the task point at which the task was suspended, and
   wherein, upon the priority point determination unit determining that there is a priority point, the specific vehicle moves to the priority point after performing the evacuation travel, and starts the task.

5. The transfer system according to claim 1, wherein the travel speed of the specific vehicle during the evacuation travel is higher than the travel speed of the specific vehicle when performing the task.

6. The transfer system according to claim 1, wherein the congestion determination unit does not perform determination processing to determine whether or not there is congestion until the duration of the task exceeds a predetermined determination start threshold value.

7. The transfer system according to claim 1, wherein a plurality of task areas are set on the transfer path, and
   wherein upon the number of times the task is suspended in one of the task areas reaching a predetermined suspension threshold value, the specific vehicle continues the task until the task in the one of the task areas completes even when the congestion determination unit has determined that there is congestion.

8. The transfer system according to claim 1, wherein a plurality of task areas are set on the transfer path, and
   wherein a congestion determination criterion is varied according to the number of transfer vehicles in the task area in which the specific vehicle is performing the task, such that the congestion determination unit is more likely to determine that there is congestion when the number is large, compared to when the number is small.

* * * * *